(12) United States Patent
Abiko

(10) Patent No.: US 6,191,596 B1
(45) Date of Patent: Feb. 20, 2001

(54) METHOD FOR DETECTING A CONTACT POSITION BETWEEN AN OBJECT TO BE MEASURED AND MEASURING PINS

(75) Inventor: Tohru Abiko, Tokyo (JP)

(73) Assignee: Advantest Corporation, Tokyo (JP)

( * ) Notice: Under 35 U.S.C. 154(b), the term of this patent shall be extended for 0 days.

(21) Appl. No.: 09/082,934

(22) Filed: May 22, 1998

(30) Foreign Application Priority Data

May 28, 1997 (JP) .................................................... 9-138632

(51) Int. Cl.$^7$ .................................................. G01R 31/02
(52) U.S. Cl. ................................................................ 324/756
(58) Field of Search ................................. 324/765, 756, 324/757, 758, 754; 702/117; 438/14, 17; 257/40, 48

(56) References Cited

U.S. PATENT DOCUMENTS

| | | | |
|---|---|---|---|
| 4,201,939 | * 5/1980 | Lee et al. ............................... | 324/754 |
| 4,780,836 | * 10/1988 | Miyazaki et al. ..................... | 324/765 |
| 4,864,227 | * 9/1989 | Sato ....................................... | 324/754 |
| 5,315,237 | * 5/1994 | Iwakura et al. ....................... | 324/754 |
| 5,436,571 | * 7/1995 | Karasawa .............................. | 324/757 |
| 5,777,485 | * 7/1998 | Tanaka et al. ........................ | 324/757 |

\* cited by examiner

*Primary Examiner*—Vinh P. Nguyen
(74) *Attorney, Agent, or Firm*—Oblon, Spivak, McClelland, Maier & Neustadt, P.C.

(57) ABSTRACT

A method is disclosed for detecting a contact position between an object under measurement and measuring pins. A semiconductor test device issues an instruction to a wafer prober control unit to control raising and down of a stage. When raising the stage in units of a predetermined distance a and detecting that the number of probe pins in contact with a wafer is equal to or greater than a constant value; the semiconductor test device lowers the stage in units of the predetermined distance a. When the number of contacted pins are less than the constant value, the device again raises the stage in units of a predetermined distance b smaller than the predetermined distance a; whereas, when the number of contacted pins is equal to or greater than the constant value, the device treats the position of the stage at that time as a first touch position.

4 Claims, 4 Drawing Sheets

METHOD FOR DETECTING A CONTACT POSITION BETWEEN AN OBJECT TO BE MEASURED AND MEASURING PINS

BACKGROUND OF THE INVENTION

1. Field of the Invention

The present invention relates to a method for detecting a contact position where probe pins are first brought into contact with a wafer at the time of an IC test.

2. Description of the Related Art

For the purpose of inspecting an IC at its wafer stage, there has been used an EB (electron beam) test system which inspects a wafer by the use of an electron beam. In this EB test system, probe pins connected to a semiconductor test device (IC tester) are first moved to detect a first touch position where the probe pins are first brought into contact with the wafer. Thereafter, the probe pins are pushed against the wafer by a constant distance from the first touch position so that the probe pins may come into certain contact with the wafer.

According to a prior art method for detecting a contact position in such an EB test system, the first touch position is detected by manually moving the wafer little by little while checking the state of contact between the wafer and probe pins with the semiconductor test device.

Such a prior art method for detecting a contact position will be explained below with reference to a flowchart of FIG. 1.

The operator first uses a semiconductor test device to conduct a contact test to find out whether or not the wafer is in contact with the probe pins (step 31). When the operator determines that the wafer is not in contact with the probe pins in step 31, the operator manually raises the stage upon which the wafer is carried by one pitch (step 32) and again conducts the contact test (step 31). When the contact between the wafer and probe pints is detected, the test processing is terminated (step 32).

However, the aforementioned prior art method is a disadvantageous in that a time necessary for the position detection is long because detection of the first touch position is carried out manually.

SUMMARY OF THE INVENTION

It is therefore an object of the present invention to provide a method, which is capable of detecting a first touch position in a short time.

To achieve the above object, there is provided in accordance with the present invention a method for detecting a contact position, which comprises the steps of moving the stage on which an object under measurement is carried up in units of a first predetermined distance and lowering the stage in units of the first predetermined distance when the number of measuring pins in contact with the object becomes equal to or greater than a predetermined constant value. And, when the number of contacted pins becomes smaller than the constant value, the stage is again raised in units of a second predetermined distance smaller than the first predetermined distance. When the number of contacted pins is equal to or greater than the constant value, the then position of the stage at that time is the first touch position.

Therefore, the present method can detect the first touch position more accurately than when the movement of the stage is carried out entirely in units of the first predetermined distance, and can detect the contact position in a shorter time than when the movement of the stage is carried out entirely in units of the smaller second predetermined distance. For this reason, the method of the present invention can automatically detect the first touch position of the object under measurement and measuring pins and also can shorten a position detection time when compared with that of the manual position detection of the prior art.

The above and other objects, features and advantages of the present invention will become apparent from the following description with reference to the accompanying drawings which illustrate examples of the present invention.

DESCRIPTION OF THE PREFERRED EMBODIMENTS (Embodiment 1):

First of all, explanation will be made as to a method for detecting a contact position in accordance with a first embodiment of the present invention.

Figure 1:
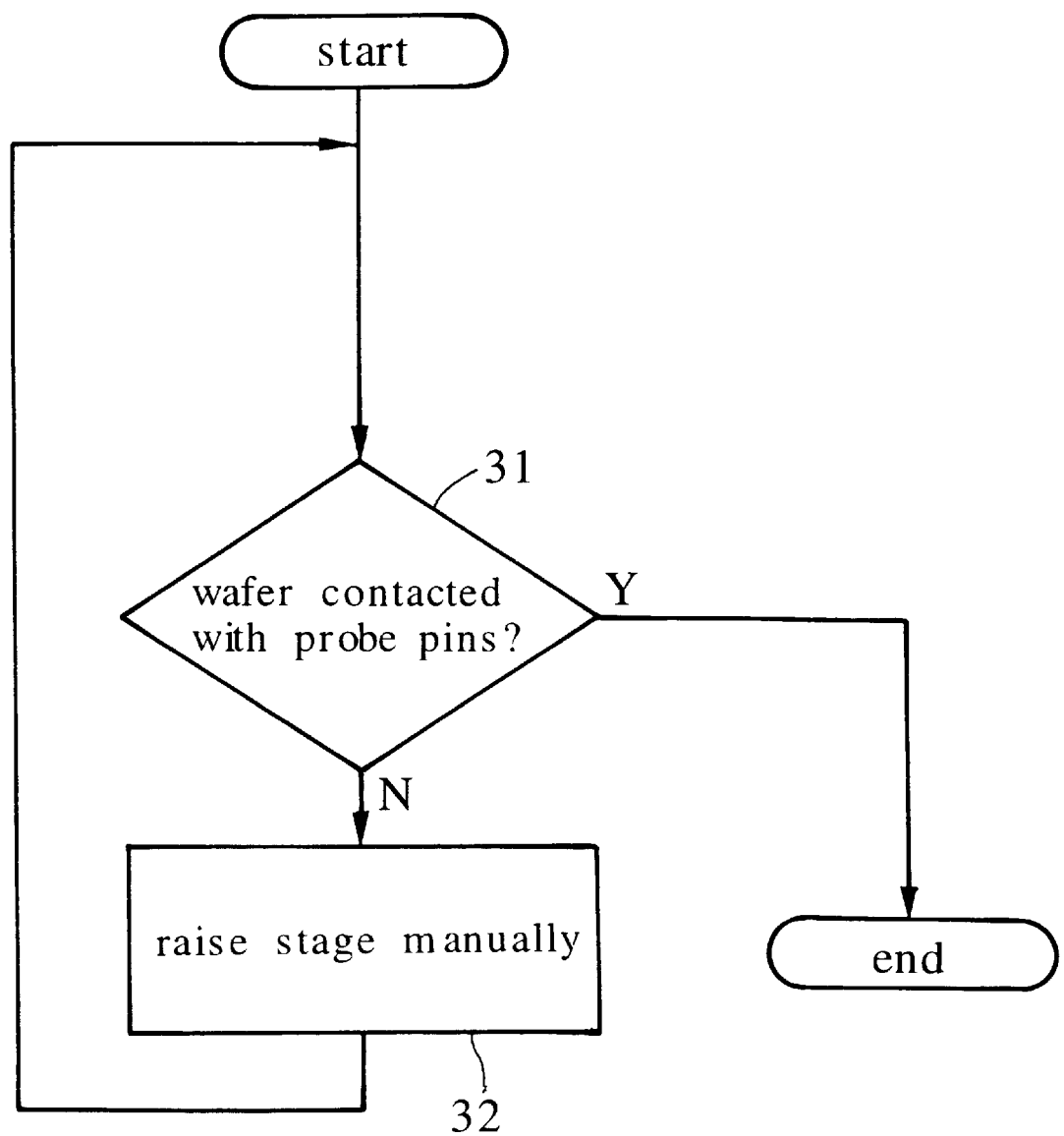
FIG. 1 is a flowchart showing a prior art method for detecting a contact position.
Figure 2:
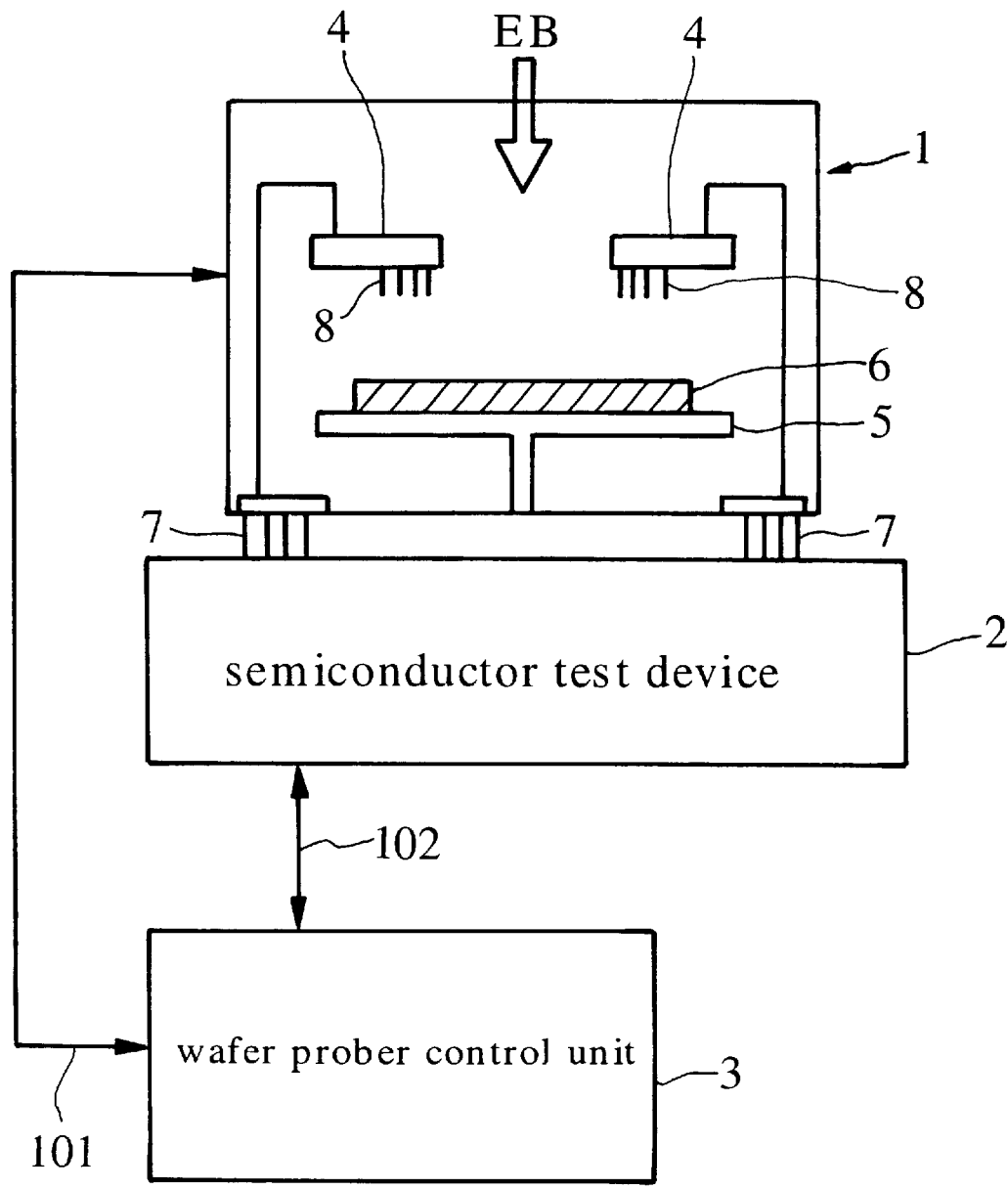
FIG. 2 is an arrangement of an EB test system to which a method for detecting a contact position in accordance with a first embodiment of the present invention is applied.

An EB test system embodying the present embodiment, as shown in FIG. 2, comprises an EB wafer prober 1, a semiconductor test device 2 connected to the EB wafer prober 1 through pogo pins 7 for performing a contact test over probe pins 8, and a wafer prober control unit 3.

The EB wafer prober 1 includes a stage 5 controlled by a wafer prober control signal 101 to be moved vertically, the probe pins 8 contacted with a wafer 6 for transmitting signals from pogo pins 7 to the wafer 6, and probe cards 4 provided with the respective probe pins 8.

When wafer prober control unit 3, receives a semiconductor test device control signal 102 from the semiconductor test device 2 requesting a movement, the wafer prober control signal 101 causes the wafer prober control unit 3 to move stage 5 vertically. After completion of the movement, the semiconductor test device control signal 102 causes the wafer prober control unit 3 to transmit an end movement notification to the semiconductor test device 2. In the illustrated example, it is assumed that a vertical distance for stage 5 to be moved by a one-time wafer prober control signal 101 can be arbitrarily set and set distance a is larger than set distance b.

The semiconductor test device 2, when receiving a semiconductor test device control signal 102 indicative of an operation start instruction from the wafer prober control unit 3, performs a contact test of probe cards 4; whereas, when receiving the end movement notification from wafer prober control unit 3, the semiconductor test device 2 sends a clear notification to the wafer prober control unit 3.

Figure 3:
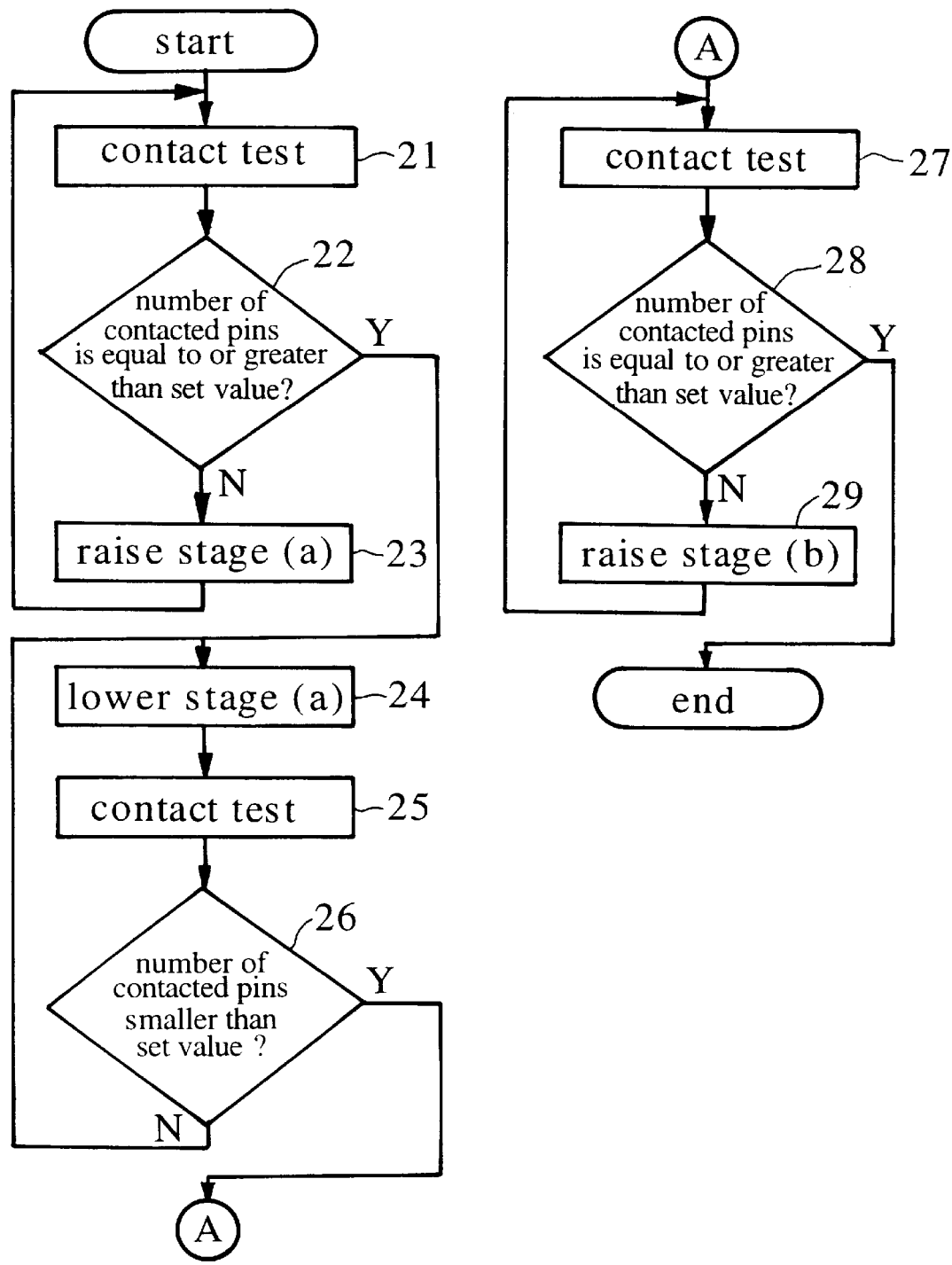
FIG. 3 is a flowchart showing the method for detecting a contact position in accordance with the first embodiment of the present invention.

Explanation will next be made as to the operation of the present embodiment with reference to FIGS. 2 and 3.

The wafer prober control unit 3 first sends the semiconductor test device control signal 102 to the semiconductor test device 2 to instruct the device 2 to start its operation.

The semiconductor test device 2, when receiving the operation start instruction, performs a contact test of the probe cards 4 through the pogo pins 7 (step 21). When the number of probe pins 8 contacted with the wafer 6 is smaller than a predetermined set value (step 22), the semiconductor test device 2 sends the semiconductor test device control signal 102 requesting a stage movement to the wafer prober control unit 3. In response to the movement request, the wafer prober control unit 3 issues the wafer prober control signal 101 to cause stage 5 to be raised by the predetermined distance a (step 23). After completion of the raising of the stage 5, the wafer prober control unit 3 notifies the semiconductor test device 2 of the raising completion. In response to the raising completion notification, the semiconductor test device 2 sends a clear notification to the wafer prober control unit 3. When receiving the clear notification, the wafer prober control unit 3 clears data held therein and sends an operation start instruction to the semiconductor test device 2. When receiving the operation start instruction from the wafer prober control unit 3, the semiconductor test device 2 performs a contact test of the probe cards 4 through the pogo pins 7 (step 21).

The operations of the above steps 21 to 23 are repeated until the semiconductor test device 2 detects in the step 22 that the number of contacted pins is equal to or greater than the set value.

When detecting in step 22 that, the number of contacted pins is larger than the set value, the semiconductor test device 2 sends a stage lowering request to the wafer prober control unit 3. The wafer prober control unit 3, when receiving the stage lowering request, lowers the stage 5 by the set distance a and then informs the semiconductor test device 2 of the movement completion. Responding to the movement completion notification, the semiconductor test device 2 sends a clear notification to the wafer prober control unit 3. When receiving the clear notification, the wafer prober control unit 3 clears data held therein and sends an operation start instruction to the semiconductor test device 2. The semiconductor test device 2, when receiving the operation start instruction, performs a contact test of the probe cards 4 through the pogo pins 7 (step 21).

The operations of the aforementioned steps 24 to 26 are repeated until the semiconductor test device 2 detects in the step 26 that the number of contacted pins are less than the set value.

When detecting in the step 26 that the number of contacted pins are less than the set value, the semiconductor test device 2 sends a clear notification to the wafer prober control unit 3. In response to the clear notification, the wafer prober control unit 3 clears the held data and sends an operation start instruction to the semiconductor test device 2. The semiconductor test device 2, when receiving the operation start instruction, performs a contact test of the probe cards 4 through the pogo pins 7 (step 27). When the number of contacted pins is equal to or greater than the set value, the semiconductor test device 2 causes the stage 5 to be raised by the predetermined distance b smaller than the predetermined distance a (step 29).

The operations of the above steps 27 to 29 are repeated until the semiconductor test device 2 detects in the step 28 that the number of contacted pins is equal to or greater than the set value.

When detecting in the step 28 that the number of contacted pins is equal to or greater than the set value, the semiconductor test device 2 sends a completion notification to the wafer prober control unit 3. Responding to the completion notification, the wafer prober control unit 3 terminates its operation, and the position of the stage 5 at that time is the first touch position.

The present embodiment can detect the first touch position more accurately than when the movement of the stage 5 is carried out based entirely on the predetermined distance a and also can detect the position in a shorter time entirely than when the movement of the stage 5 is carried out based entirely on the predetermined distance b.

As a result, the present invention can automatically detect the first touch position between the wafer 5 and probe pins 8 by means of the wafer prober control unit 3, so that the present invention can shorten its position detection time when compared with that of the prior art.

(Embodiment 2):

Explanation will next be made of a method for detecting a contact position in accordance with a second embodiment.

The present embodiment is used when applied to a handler as a semiconductor test system for performing a test of a packaged IC, while the aforementioned first embodiment is applied to an EB test system as a semiconductor test system for performing test of a wafer.

When an IC test is performed by a handler, a socket is used at the place of contact of the IC to be measured and the measuring circuit, and by pushing the IC downward into the socket the IC terminals are brought into electrical contact with the socket pins.

In the EB test system a high accuracy of positional setting between the probe pins and wafer is required; whereas, the handler does not require a high accuracy for the force of pushing the IC toward the socket. For this reason, if the system can only detect that the number of contacted pins corresponding to the number of pins in the socket brought into contact with the IC terminals is equal to or greater than a set value, then the system can treat the IC position as the first touch position. When the terminals of the IC are finally pushed into the socket from the first touch position by a predetermined distance, contact between the IC and socket can be realized steadily.

Figure 4:
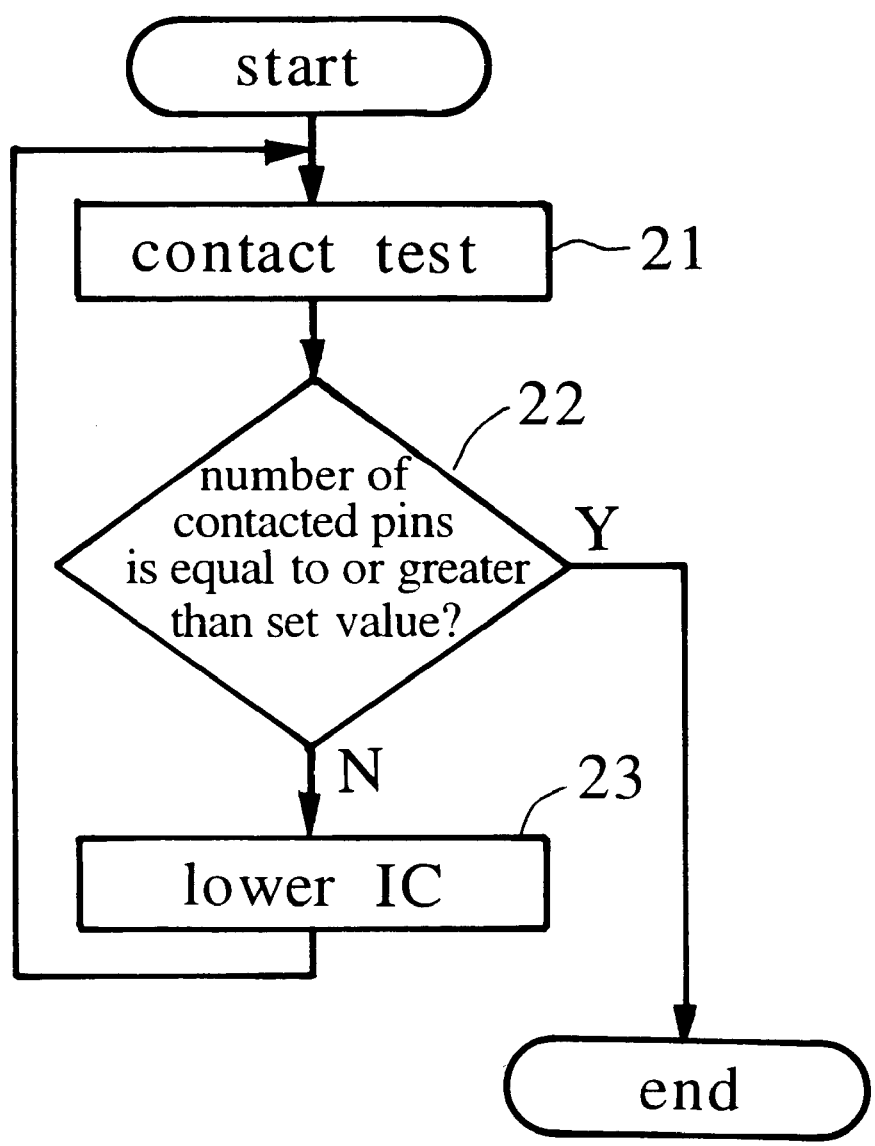
FIG. 4 is a flowchart showing a method for detecting a contact position in accordance with a second embodiment of the present invention.

Explanation will next be made as to a method for detecting a contact position in accordance with a second embodiment of the present invention, by referring to a flowchart of FIG. 4.

The semiconductor test device first performs contact test with an IC to be measured through a socket (step 21). When the number of pins in contact is smaller than a set value, the IC is lowered to be further pushed against the socket (step 23). And the semiconductor test device again performs its contact test (step 21).

The operations of the above steps 21 to 23 are repeated until the semiconductor test device detects in the step 22 that the number of contacted pins is larger than the set value.

And when detecting in the step 22 that the number of contacted pins is larger than the set value, the semiconductor test device treats the IC position at that time as the first touch position.

While preferred embodiments of the present invention have been described using specific terms, such description is for illustrative purposes only, and it is to be understood that changes and variations may be made without departing from the spirit or scope of the following claims.

What is claimed is:

1. A method for detecting a position where measuring pins are brought into contact with an object to be measured, comprising the steps of:

raising a stage having said object carried thereon in multiples of a first predetermined distance until at least a predetermined number of pins contact said object;

lowering said stage in multiples of said first predetermined distance until less than the predetermined number of pins contact said object;

raising said stage in multiples of a second predetermined distance smaller than said first predetermined distance until at least the predetermined number of pins contact said object; and determining the position of the stage as the position when the predetermined number of pins contact the object.

2. A method as set forth in claim 1, wherein said object is a wafer and said measuring pins are probe pins.

3. A semiconductor test system for detecting a position where measuring pins are brought into contact with an object to be measured, comprising:

a semiconductor test device coupled to the measuring pins and configured to determine the number of pins that contact the object; and a control unit coupled to the semiconductor test device and configured to:

raise a stage having the object carried thereon in multiples of a first predetermined distance until at least a predetermined number of pins contact the object, lower the stage in multiples of the first predetermined distance until less than the predetermined number of pins contact the object, raise the stage in multiples of a second predetermined distance smaller than the first predetermined distance until at least the predetermined number of pins contact the object, and determine the position of the stage as the position, when the predetermined number of pins contacts the object.

4. A test system for detecting a position where measuring pins are brought into contact with an object to be measured, comprising:

a semiconductor test device coupled to the measuring pins and configured to determine the number of pins that contact the object; and a control unit coupled to the semiconductor test device and configured to:

raise a stage having the object carried thereon in multiples of a first predetermined distance until at least a predetermined number of pins contact the object, lower the stage in multiples of the first predetermined distance until less than the predetermined number of pins contact the object, raise the stage in multiples of a second predetermined distance smaller than the first predetermined distance until at least the predetermined number of pins contact the object, and determine the position of the stage as the position, when the predetermined number of pins contacts the object.

* * * * *